(12) United States Patent
Kim et al.

(10) Patent No.: US 9,706,644 B2
(45) Date of Patent: Jul. 11, 2017

(54) PRINTED CIRCUIT BOARD AND MANUFACTURING METHOD THEREOF

(71) Applicant: Samsung Electro-Mechanics Co., Ltd., Suwon-Si (KR)

(72) Inventors: Sung-Han Kim, Seoul (KR); Han Kim, Yongin-Si (KR); Mi-Sun Hwang, Suwon-Si (KR); Sang-Yul Ha, Hwaseong-Si (KR); Seok-Hwan Ahn, Seongnam-Si (KR); Kyung-Ho Lee, Suwon-Si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 15/084,864

(22) Filed: Mar. 30, 2016

(65) Prior Publication Data
US 2017/0055345 A1 Feb. 23, 2017

(30) Foreign Application Priority Data

Aug. 19, 2015 (KR) ........................ 10-2015-0116924

(51) Int. Cl.
| | | |
|---|---|---|
| *H05K 1/11* | (2006.01) | |
| *H05K 1/00* | (2006.01) | |
| *H05K 1/02* | (2006.01) | |
| *H05K 3/10* | (2006.01) | |
| *H05K 3/00* | (2006.01) | |
| *H05K 3/46* | (2006.01) | |

(52) U.S. Cl.
CPC ......... *H05K 1/0271* (2013.01); *H05K 1/0298* (2013.01); *H05K 1/115* (2013.01); *H05K 3/0017* (2013.01); *H05K 3/10* (2013.01); *H05K 3/4644* (2013.01); *H05K 2201/2009* (2013.01)

(58) Field of Classification Search
CPC .................... H05K 1/0271; H05K 2201/2009
USPC ................................... 174/250, 262
See application file for complete search history.

(56) References Cited

U.S. PATENT DOCUMENTS

2008/0308305 A1* 12/2008 Kawabe ............ H01L 23/49833
174/255
2009/0166077 A1* 7/2009 Hirakawa ............ H05K 1/0271
174/262

\* cited by examiner

*Primary Examiner* — Sherman Ng
(74) *Attorney, Agent, or Firm* — NSIP Law (57) ABSTRACT

A printed circuit board and a method of manufacturing the same is provided. The printed circuit board includes an insulating substrate, a circuit disposed on the insulating substrate, a pair of first reinforcements spatially separated in the insulating substrate, the first reinforcements extending parallel to a surface of the insulating substrate, and a second reinforcement configured to connect the pair of first reinforcements.

20 Claims, 6 Drawing Sheets

PRINTED CIRCUIT BOARD AND MANUFACTURING METHOD THEREOF

CROSS REFERENCE TO RELATED APPLICATION(S)

This application claims the benefit under 35 USC §119(a) of Korean Patent Application No. 10-2015-0116924 filed on Aug. 19, 2015 in the Korean Intellectual Property Office, the entire disclosure of which is incorporated herein by reference for all purposes.

BACKGROUND

1. Field

The following description relates to a printed circuit board and a method for manufacturing the same.

2. Description of Related Art

Due to the development of electronic devices, the printed circuit board has evolved to be lightweight, thin, and small in size. As the circuit board becomes thinner, the board itself has decreased stiffness, causing defects due to warpage issues when components or chips are mounted thereon. To reduce warpage, materials having high stiffness can be used to manufacture a printed circuit board.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a printed circuit board includes an insulating layer, a circuit disposed on the insulating layer, a pair of plate-shaped first reinforcements disposed in the insulating layer, the pair being spatially separated, and a second reinforcement configured to connect the pair of plate-shaped first reinforcements.

The pair of first reinforcements extend may parallel to a surface of the insulating layer, and the second reinforcement passes through the insulating layer across a thickness thereof, perpendicular to the pair of first reinforcements.

The second reinforcement may be formed sequentially following the first reinforcement.

The insulating layer may include multiple layers, and a first of the pair of the first reinforcements may be disposed on an uppermost layer of the insulating layer, and a second of the pair of the first reinforcements may be disposed on a lowest layer of the insulating layer.

The pair of first reinforcements and the second reinforcement may be integrally formed.

A width of the second reinforcement may be twice the thickness of each of the pair of first reinforcements.

A plurality of the second reinforcements may be disposed discretely along the pair of first reinforcements. At least a part of the circuit may be arranged between the second reinforcements.

In another general aspect, a method for manufacturing a printed circuit board is provided. The method includes forming a circuit on an insulating layer, forming a pair of spatially separated plate-shaped first grooves in the insulating layer, forming a second groove connecting the pair of first grooves, and filling the pair of first grooves and the second groove with a reinforcing material.

The pair of first grooves may extend parallel to a surface of the insulating layer, and the second groove may pass through the insulating layer across a thickness thereof, perpendicular to the pair of first grooves.

The second groove may be formed sequentially following the first groove.

The insulating layer may include multiple layers and a first of the pair of the first grooves may be formed on an uppermost layer of the insulating layer, and a second of the pair of first grooves is formed on a lowest layer of the insulating layer.

The filling the pair of first grooves and the second groove with a reinforcing material may include forming a seed layer inside the pair of first grooves and the second groove, and forming a plating layer on the seed layer. A width of the second groove may be twice the thickness of each of the pair of first grooves.

A plurality of the second grooves may be formed discretely along the pair of first grooves. At least a part of the circuit may be arranged between the second grooves.

In yet another general aspect, a printed circuit board is described. The printed circuit board includes an insulating substrate, a circuit disposed on the insulating layer, and an I-beam shaped reinforcement structure disposed across a thickness of the insulating substrate.

The I-beam shaped reinforcement structure may include a same metal as used for the circuit.

Top and bottom horizontal arms of the I-beam shaped reinforcement structure may be disposed to extend along a top and bottom surface of insulating substrate respectively.

A vertical arm of the I-beam shaped reinforcement structure may include of a plurality of vertical structures disposed discretely along a cross-section of the insulating substrate so as to connect top and bottom horizontal arms of the I-beam shaped reinforcement structure.

Other features and aspects will be apparent from the following detailed description, the drawings, and the claims.

BRIEF DESCRIPTION OF THE DRAWINGS

Throughout the drawings and the detailed description, unless otherwise described or provided, the same drawing reference numerals refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure is thorough, complete, and conveys the full scope of the disclosure to one of ordinary skill in the art.

It will be understood that, although the terms "first," "second," "third," "fourth" etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. Similarly, when it is described that a method includes series of steps, a sequence of the steps is not a sequence in which the steps should be performed in the sequence, an arbitrary technical step may be omitted and/or another arbitrary step, which is not disclosed herein, may be added to the method.

Throughout the description of the present disclosure, terms such as "upper", "the uppermost", "lower", and "the lowest" are represented based on the direction of attached figures so that they may be actually different depending on the direction to which a device is arranged.

Unless indicated otherwise, a statement that a first layer is "on" a second layer or a substrate is to be interpreted as covering both a case where the first layer directly contacts the second layer or the substrate, and a case where one or more other layers are disposed between the first layer and the second layer or the substrate.

The terminology used herein is for the purpose of describing particular examples only, and is not intended to limit the scope of the disclosure in any way. As used herein, the singular forms "a," "an," and "the" are intended to include the plural forms as well, unless the context clearly indicates otherwise. It will be further understood that the terms "include" and/or "have," when used in this specification, specify the presence of stated features, numbers, operations, elements, components, or combinations thereof, but do not preclude the presence or addition of one or more other features, numbers, operations, elements, components or combinations thereof.

Unless otherwise defined, all terms, including technical and scientific terms, used herein have the same meaning as commonly understood by one of ordinary skill in the art to which this description pertains. It will be further understood that terms, such as those defined in commonly used dictionaries, should be interpreted as having a meaning that is consistent with their meaning in the context of the relevant art and are not to be interpreted in an idealized or overly formal sense unless expressly so defined herein.

The terms used herein may be exchangeable to be operated in different directions than shown and described herein under an appropriate environment. It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
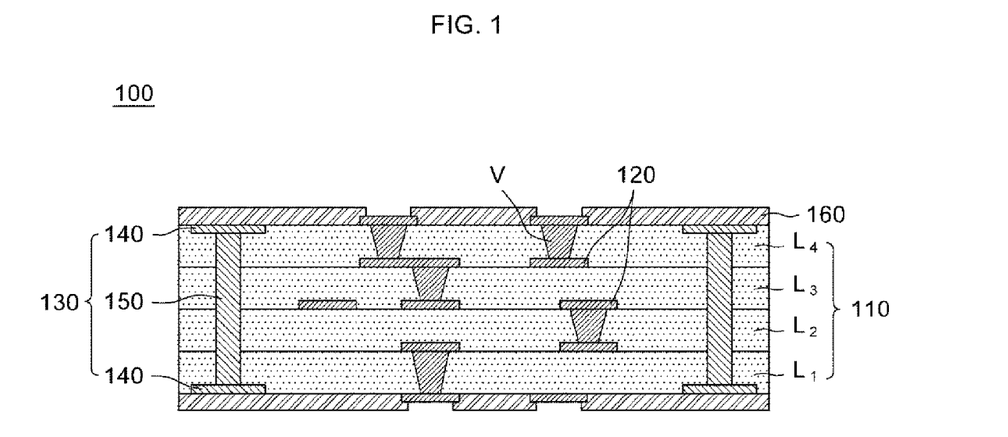
FIG. 1 is a diagram illustrating a cross-section of an example of a printed circuit board.
Figure 2:
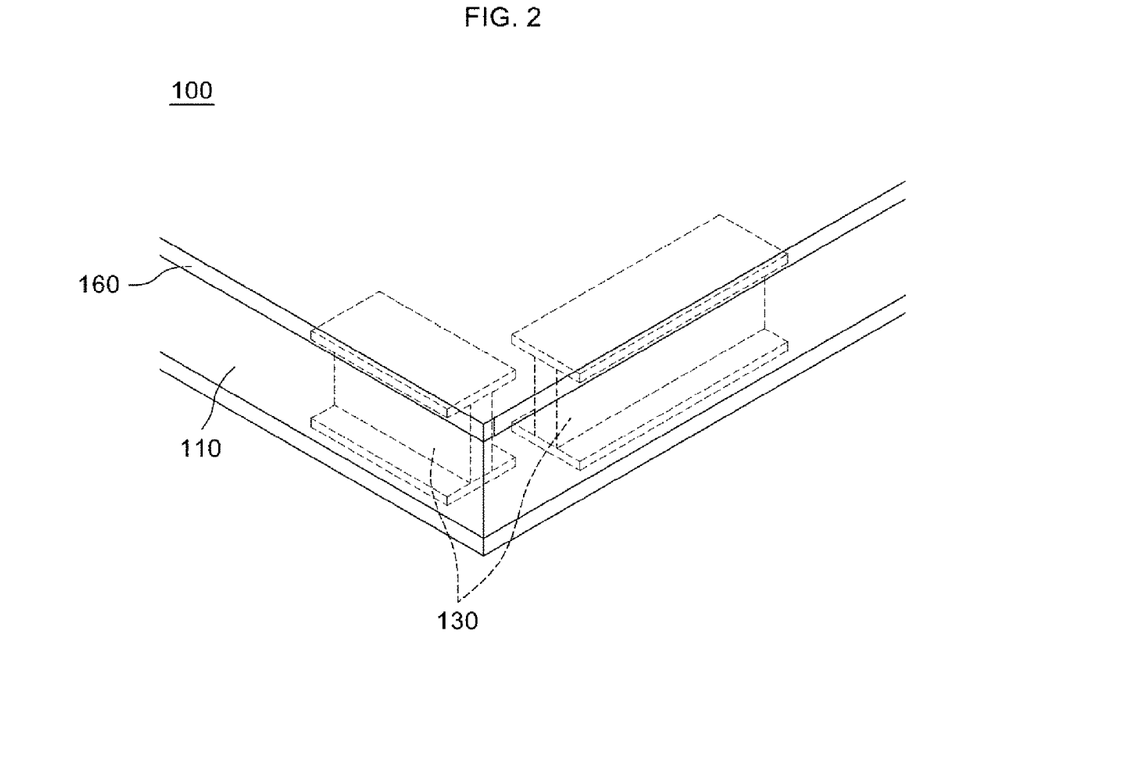
FIG. 2 is a diagram illustrating a perspective view of part of an example of a printed circuit board.
Figure 3:
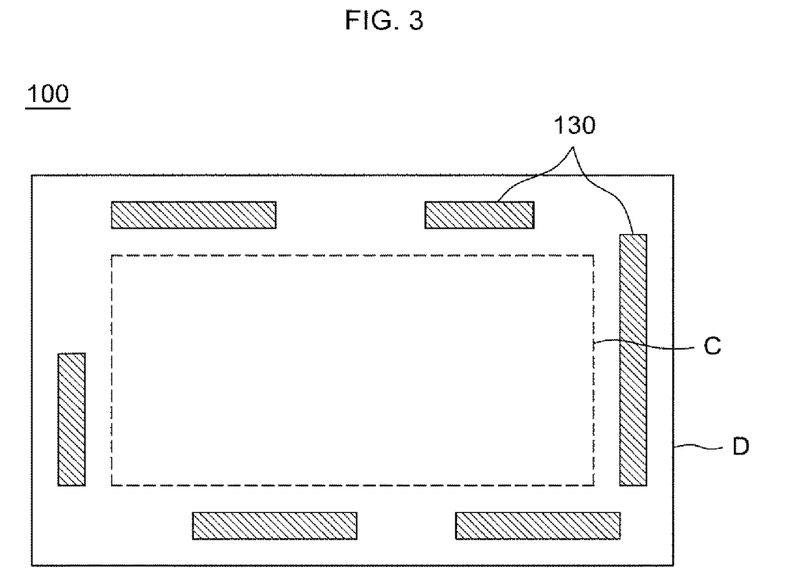
FIG. 3 is a diagram illustrating a planar view of reinforcement of an example of a printed circuit board.
Figure 4:
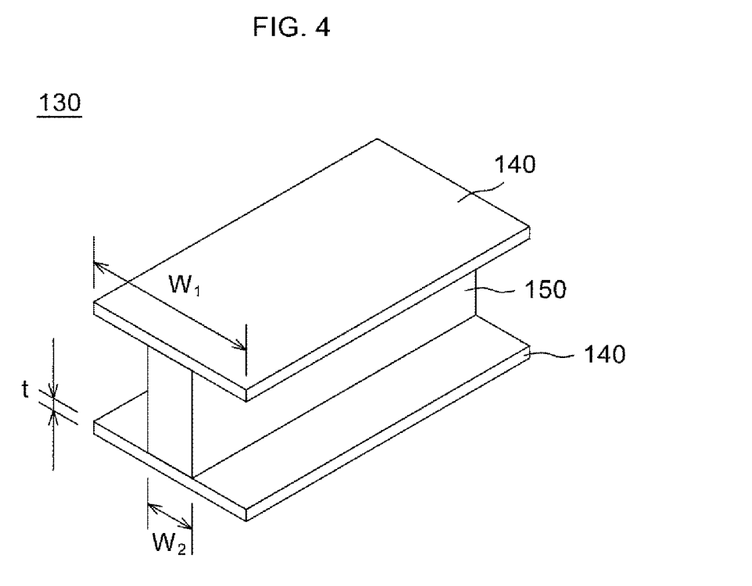
FIG. 4 is a diagram illustrating a perspective view of a reinforcement of an example of a printed circuit board.

FIG. 1 is a diagram illustrating an example of a printed circuit board, FIG. 2 is a diagram illustrating a part of an example of a printed circuit board, FIG. 3 is a diagram illustrating a reinforcement of an example of a printed circuit board, and FIG. 4 is a diagram illustrating arrangement of a reinforcement of an example of a printed circuit board.

Referring to FIG. 1, a printed circuit board according to an example includes an insulating layer 110, a circuit 120, and a reinforcement 130. The printed circuit board further includes a solder resist 160. The reinforcement 130 includes a first reinforcement 140 and a second reinforcement 150.

The printed circuit board (PCB) electrically connects electronic components mounted thereon through the circuit 120 formed on the insulating layer 110. In an embodiment, the insulating layer 110 is a phenolic resin insulating plate or an epoxy resin insulating plate, which supplies power and mechanically supports the electronic components mounted thereon. PCBs can be single sided, double sided or multilayer The circuit 120 is a conductive pattern formed on the insulating layer 110 to transmit electrical signals according to a desired design. The circuit 120 may be formed of a metal having high conductivity such as, for example, copper, nickel, iron, silver, or gold. In case of a double sided board or a multilayered board, a via V may be formed to electrically connect the circuits 120 formed on different layers $L_1$, $L_2$, $L_3$, and/or $L_4$.

The circuits may not be formed at the edges of the printed circuit board where other external devices may be connected because they may be easily damaged during transferring the printed circuit board and/or connecting with a final product. While parts of the printed circuit board where the circuit is formed and the parts where the circuit is not formed are not explicitly distinguished in the figures, the parts where the circuit 120 is formed are referred to herein as a circuit portion C and the parts where the circuit is not formed are referred to herein as a dummy portion D.

The reinforcement 130 may be inserted into the printed circuit board to increase stiffness of the printed circuit board. Referring to FIGS. 2 and 3, the reinforcement 130 is formed at the dummy portion D to prevent undesired contact with the circuit 120 at the circuit portion C. In an embodiment, the reinforcement 130 is formed in a shape of an elongated rectangle along an outer edge of the circuit portion C of the printed circuit board. In some embodiments, a plurality of the reinforcements 130 are discretely provided at the dummy portion D. One of skill in the art will appreciate that the shapes of various structures shown in the Figures are merely illustrative, and are not limited thereto. Other shapes reasonably suitable for the respective structures are contemplated within the scope of this disclosure.

In an embodiment, the reinforcement 130 is provided to be in contact with a hole (not explicitly shown) provided in the dummy portion D of the printed circuit board. The hole may be connected with an external device for support during processing of the printed circuit board.

In an embodiment, the reinforcement 130 is formed in the periphery of the chip-mounting portion (not shown). Because warpage is more likely to result from a difference of coefficient of thermal expansion between the chip and the insulating layer 110 at the chip-mounting portion, providing the reinforcement 130 along the periphery of the chip-mounting portion may reduce or prevent warpage issues.

The reinforcement 130 may be formed of a material having high stiffness such as, for example, copper, nickel, iron, or invar. In an embodiment, the reinforcement 130 is formed of the same material used for forming the pattern of the circuit 120. When the reinforcement 130 is formed of a metal such as copper, heat dissipation capacity of the printed circuit board may be improved. Moreover, the relatively high electrical conductivity of copper may facilitate shielding of noise signals from the circuit 120. In some embodiments, the reinforcement 130 is formed of a glass cloth.

The reinforcement 130 may include the first reinforcement 140 and the second reinforcement 150. The first reinforcement 140 may be formed in a pair arranged to be spatially separated from each other in the insulating layer 110. The first reinforcement 140 may include a structure extending parallel to a surface of the insulating layer. In an embodiment, the first reinforcement 140 has a shape such as, for example, a convex polygon disposed along a surface of the insulating layer and having a thickness extending into the depth of the insulating layer. For example, the first reinforcement 140 may have the shape of a plate, or a board. The first reinforcement 140 may provide resistance to warpage moment. An area of the plate-shaped first reinforcement 140 may be greater than that of the via V. Because the via V is formed to connect between layers in the circuit portion C, the cross-section area of the via V is relatively small. In some embodiments, the first reinforcement 140 is provided in several portions to increase a stiffness of the printed circuit board.

In an embodiment, a pair of the first reinforcements 140 is disposed along the top and bottom surfaces of insulating layer 110. For example, in embodiments where the insulating layer 110 includes multiple layers $L_1$, $L_2$, $L_3$, and $L_4$, a thickness t of the first reinforcement 140 may be thinner than that of one, or all of the layers of the insulating layer 110. For example, in an embodiment, a first of the pair of first reinforcements 140 is disposed on the uppermost layer $L_4$ of the insulating layer 110 and a second of the pair of first reinforcements 140 is disposed on the lowermost layer $L_1$ of the insulating layer 110. When the first reinforcement 140 is disposed on the outermost layer(s), the effect of preventing the warpage may be increased.

Referring back to FIG. 1, the pair of first reinforcements 140 are disposed at the outermost surfaces of the uppermost layer $L_4$ and the lowermost layer $L_1$ of the insulating layer 110. That is, one surface of each of the pair of first reinforcements 140 is in contact with an exposed surface of insulating substrate 110. The exposed surface of the first reinforcements 140 may be covered by a solder resist 160 as explained elsewhere herein.

In FIG. 1, the second reinforcement 150 is provided inside the insulating layer 110 and arranged between the pair of first reinforcements 140 to connect the pair of the first reinforcements 140. For example, when the pair of first reinforcements 140 are disposed along the surfaces of the insulating layer 110, the second reinforcement 150 may pass through the insulating layer 110 across a thickness thereof, perpendicular to the pair of first reinforcements 140.

In an embodiment, the first reinforcement 140 and the second reinforcement 150 may be integrally formed. In other words, in such embodiment, the first reinforcement 140 and the second reinforcement 150 may be formed at the same time. In some embodiments, a lateral length of the second reinforcement 150 extends along the entire length of the first reinforcement 140. In such embodiments, the second reinforcement 150 is formed sequentially following the first reinforcement 140. The second reinforcement 150, in such embodiments, is the same shape as, and extends perpendicular to, the first reinforcement 140.

Referring to FIG. 4, in embodiments where the second reinforcement 150 has a shape of a plate, a width w2 of the second reinforcement 150 is less than a width w1 of the first reinforcement 140 and the second reinforcement 150 is arranged at the center of the first reinforcement 140 creating a reinforcement 130 in the shape of an 'I'-beam. In such embodiments, each of the pair of first reinforcements 140 forms a horizontal portion of the 'I' along a surface of the insulating layer 110, and the second reinforcement 150 forms the vertical portion of the 'I' beam across a thickness of the insulating layer 110, and connecting the pair of first reinforcements 140. In some embodiments, the reinforcement 130 forms an 'H'-beam. In such embodiments, the pair of first reinforcements 140 form the vertical portions of the 'H'-beam across a thickness of the insulating layer 110, and the second reinforcement 150 forms the horizontal portion of the 'H'-beam, extending parallel to a surface of the insulating layer 110.

In some embodiments, the width w2 of the second reinforcement 150 is greater than the thickness t of the first reinforcement 140. In some embodiments, the width w2 of the second reinforcement 150 may be twice the thickness t of the first reinforcement 140.

In embodiments where a first of the pair of first reinforcements 140 is disposed on the uppermost layer L4 of the insulating layer 110 and a second of the pair is disposed on the lowermost layer L1 of the insulating layer 110, the second reinforcement 150 may extend the entire cross section of insulating substrate 110 to connect the pair of the first reinforcements 140.

The solder resist 160 may be a protection layer to protect the circuit 120, and may cover all or part of the circuit 120. In some embodiments, portions of the circuit 120 that are designed to be exposed are left uncovered by the solder resist 160. In some embodiments, the first reinforcements 140, disposed along the uppermost layer $L_4$ and the lowermost layer $L_1$ of the insulating substrate 110, are also covered by the solder resist 160. In embodiments where the first reinforcement 140 is formed of a metal, it may be desirable to cover the first reinforcement 140 by the solder resist 160 to prevent undesired short or corrosion such as oxidation.

The printed circuit board including the reinforcement as described herein provides high stiffness against bending (warpage) and torsion. Damage and failure can be further reduced.

Figure 5:
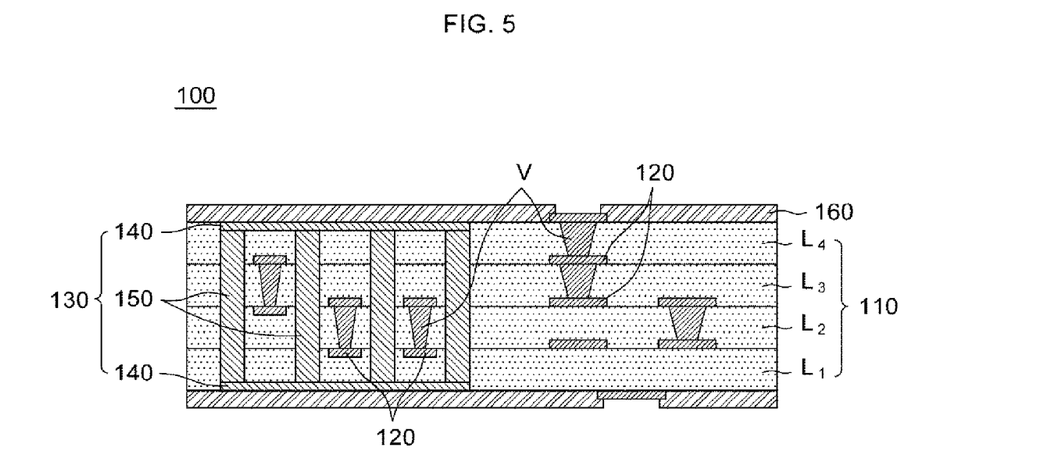
FIG. 5 is a diagram illustrating a cross-section of another example of a printed circuit board.
Figure 6:
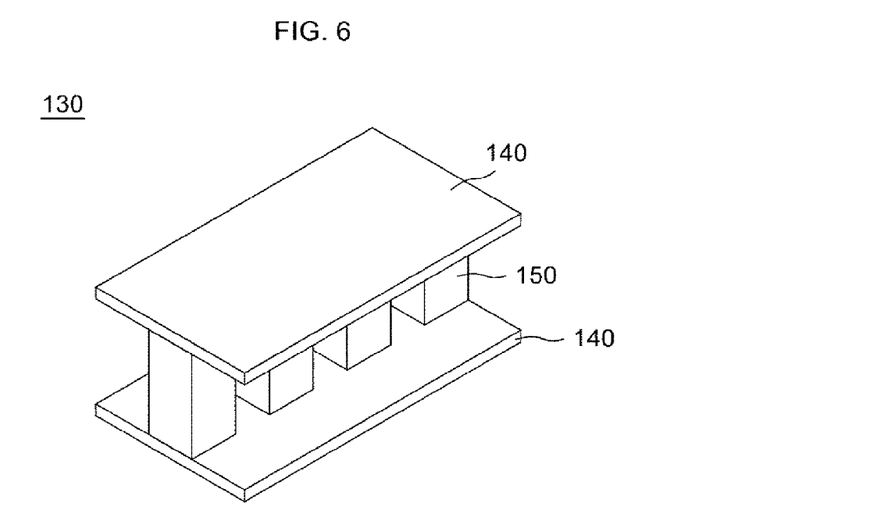
FIG. 6 is a diagram illustrating a perspective view of reinforcement of another example of a printed circuit board.

FIG. 5 is a diagram illustrating another example of a printed circuit board and FIG. 6 is a diagram illustrating a reinforcement of the example of FIG. 5.

Referring to FIG. 5, a printed circuit board according to another example includes an insulating layer 110, a circuit 120, and a reinforcement 130. The reinforcement 130 includes a first reinforcement 140 and a second reinforcement 150. The printed circuit board may further include a solder resist 160.

In the interest of conciseness, only those portions that differ from the example described with reference to FIGS. 1 and 2 will be described in the following description.

Referring to FIG. 5, a plurality of the second reinforcements 150 is provided discretely along the first reinforcement 140 so as to connect the pair of the first reinforcements 140. The second reinforcements 150 may have any cross-sectional shape including, for example, a quadrilateral, a triangle, a convex or non-convex polygon, a circle, an ellipse, a conic section, or any combination thereof. One of skill in the art will recognize that the cross-sectional shape of the second reinforcements 150 may not be limited thereto. Moreover, the plurality of the second reinforcements 150 may not have the same cross-sectional shape or area.

In some embodiments, it may be desirable to provide the reinforcement 130 in the circuit portion C to use a limited space of the printed circuit board effectively. In such embodiments, the circuit 120 may be disposed in a space between the second reinforcements 150. As shown in FIG. 5, the via V may also be provided in the space between the second reinforcements 150. The distance between the second reinforcements 150 may be greater than the width of the circuit 120. In such embodiments, second reinforcements 150 of different shapes and/or areas may be desirable for providing suitable space for disposing circuit patterns between neighboring second reinforcements.

The first reinforcement 140 may be disposed on the uppermost layer $L_4$ and the lowest layer $L_1$ of the insulating layer 110. The first reinforcement 140 may be covered by the solder resist 160 to prevent exposure to outside environment.

Figure 7:
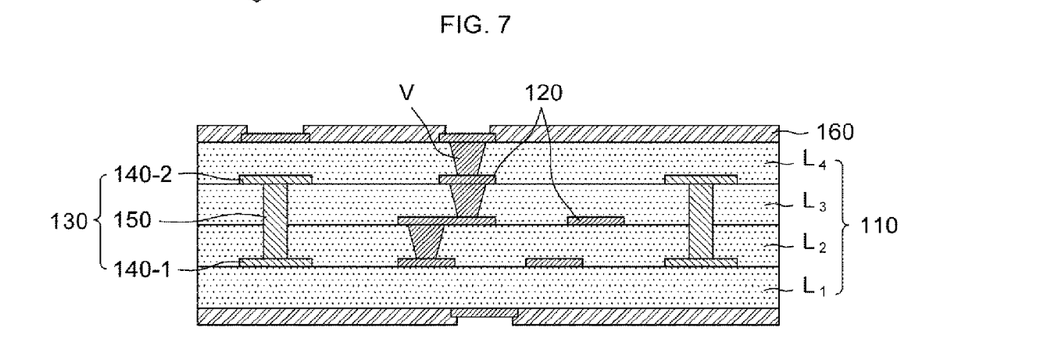
FIG. 7 is a diagram illustrating a cross-section of yet another example of a printed circuit board.
Figure 8A:
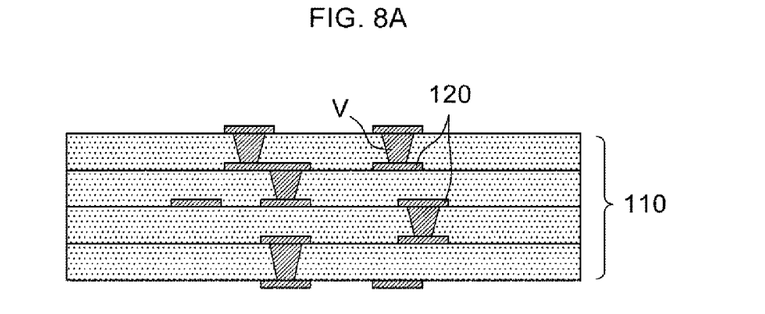
FIGS. 8A-8F are diagrams illustrating cross-sections of a printed circuit board manufactured with an example of a method for manufacturing a printed circuit board.
Figure 8B:
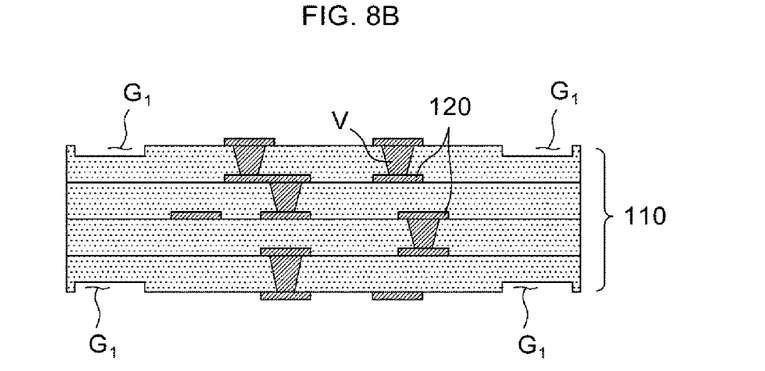
Figure 8C:
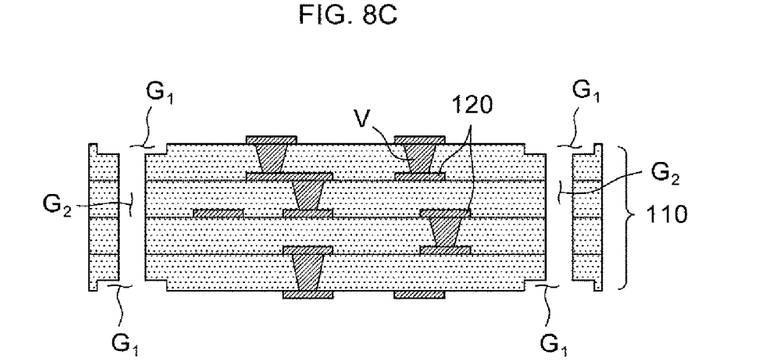
Figure 8D:
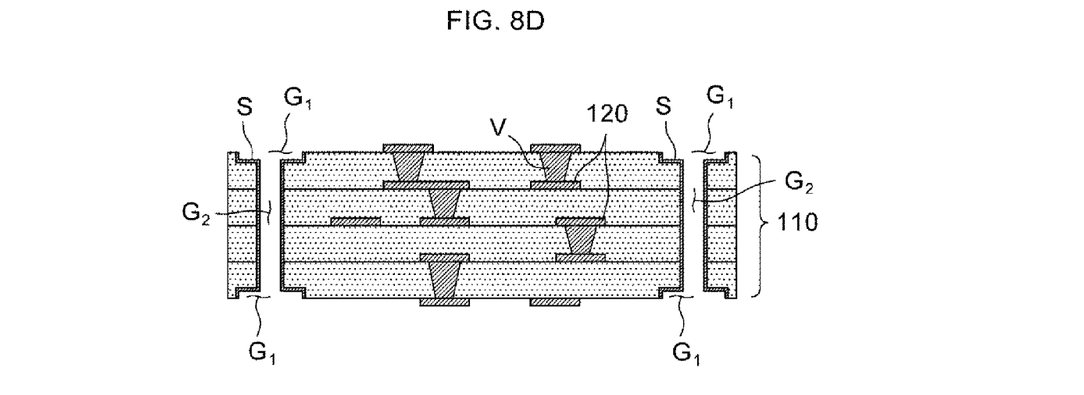
Figure 8E:
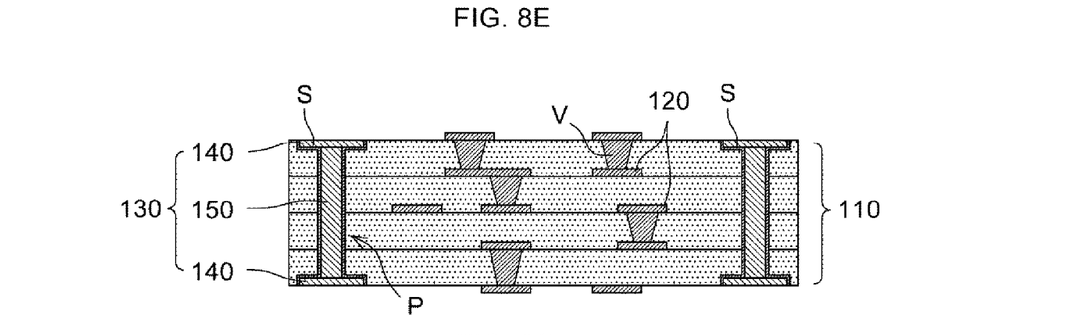
Figure 8F:
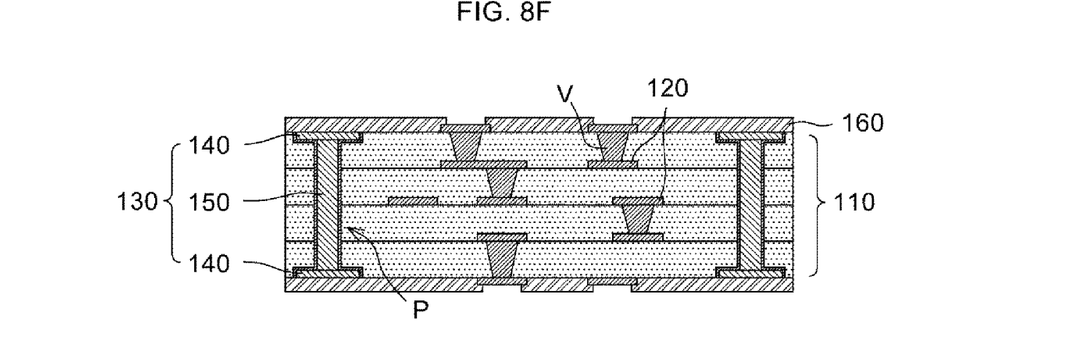
Figure 9A:
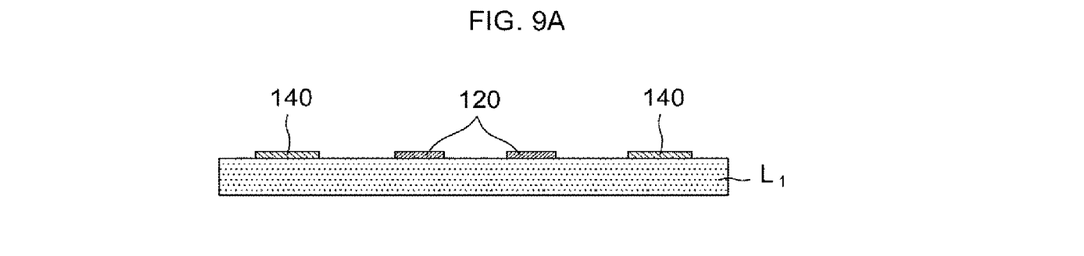
FIGS. 9A-9D are diagrams illustrating cross-sections of a printed circuit board of FIG. 7 manufactured with an example of a method for manufacturing a printed circuit board.
Figure 9B:
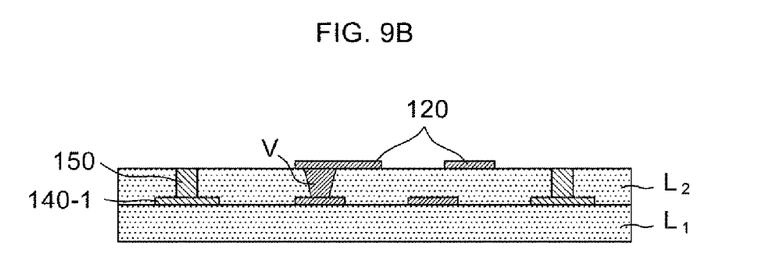
Figure 9C:
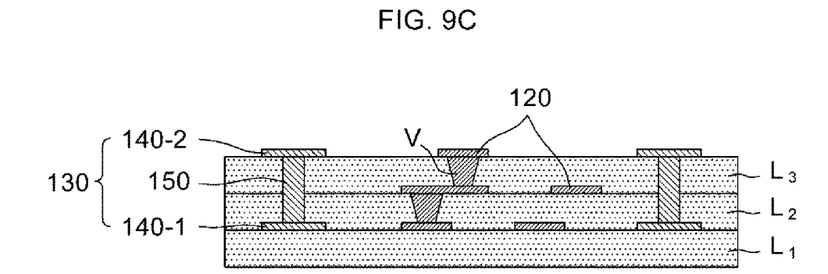
Figure 9D:
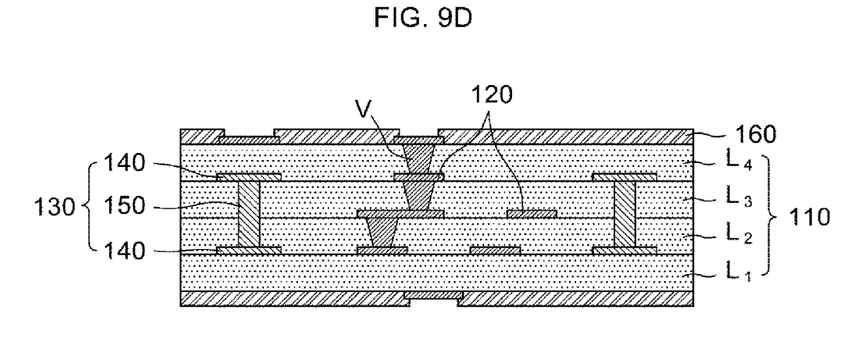

FIG. 7 is a diagram illustrating yet another example of a printed circuit board.

Referring to FIG. 7, a printed circuit board includes an insulating layer 110, a circuit 120, and a reinforcement 130. The reinforcement 130 includes a first reinforcement 140 and a second reinforcement 150. The printed circuit board may further include a solder resist 160.

The first reinforcement 140 may be formed not to be exposed from the insulating substrate 110. For example, the first reinforcement 140 may be formed on the same surface as the circuit 120. In embodiments where the first reinforcement 140 is formed of the same metal used for the circuit 120, the first reinforcement 140 may be formed by the same method used for forming the circuit 120.

Referring to FIG. 9, in embodiments where the insulating layer 110 includes a plurality layers $L_1$, $L_2$, $L_3$, $L_4$, the circuit 120 and a first 140-1 of a pair of the first reinforcements may be formed on the first layer $L_1$ of the insulating layer 110. The circuit 120 and the first reinforcement 140-1 may be formed through a semi-additive process at the same time.

The second layer $L_2$ of the insulating layer 110 may be laminated on the first layer $L_1$. The circuit 120 may be formed on the second layer $L_2$ and at the same time, the second reinforcement 150 may also be formed on the first reinforcement 140. The second reinforcement 150 may be grown with the same process. When the last layer $L_4$ of the insulating layer 110 is laminated, the circuit 120 may be formed on the third layer $L_3$ and a second 140-2 of the pair of the first reinforcements may be formed. The circuit 120 and the first reinforcement 140-2 may also be formed at the same time using a suitable process such as, for example, a semi-additive process.

The reinforcement 130 and the circuit 120 may be formed at the same time without any additional process so that a manufacturing process can be simplified.

FIGS. 8A-F are diagrams illustrating an example of a method for manufacturing a printed circuit board. It will be understood that the method is performed in an order of FIGS. 8-F. Referring to FIGS. 8A-F, a method for manufacturing a printed circuit board according to an example includes forming a circuit 120 on an insulating layer 110; forming a pair of spatially separated plate-shaped first grooves G1 in the insulating substrate 110; forming a second groove G2 connecting the pair of first grooves G1, and filling the pair of first grooves G1 and the second groove G2 with a reinforcing material.

In this example, the circuit 120 is formed before forming the reinforcement 130. The insulating layer 110 may include multiple layers and in some embodiments, the circuit 120 may be formed on one surface or both surfaces of each layer of the insulating layers 110. In such embodiments, the circuits 120 formed on each layer may be connected through vias V.

The operation for forming a first groove G1 includes forming a pair of spatially separated plate-shaped first grooves G1 in the insulating layer 110. In an embodiment, the pair of first grooves G1 may extend parallel to a surface of the insulating substrate 110.

The pair of first grooves G1 may be formed in the uppermost layer and the lowermost layer of a multilayered insulating layer 110. That is, a first of the pair of the first grooves G1 may be formed in an uppermost layer and a second of the pair in the lowermost layer. In such an embodiment, the pair of first grooves G1 are disposed along the outermost top and bottom surfaces of the insulating layer 110.

The first groove G1 may be formed by any suitable method such as, for example, etching or laser drilling.

The operation for forming a second groove G2 includes forming a second groove G2 to pass through the pair of first grooves G1 and be positioned between the pair of first grooves G1. The second groove G2 may be formed by any suitable method such as, for example, etching or laser drilling.

In embodiments where the pair of first grooves G1 are formed to extend along a surface of the insulating layer 110, the second groove G2 may pass through the insulating layer 110 across a thickness thereof, perpendicular to the pair of first grooves G1. In embodiments where the insulating layer 110 includes multiple layers, the second groove G2 may pass through all or some of the multiple layers of the insulating layer 110.

The second groove G2 may be formed sequentially following the first groove G1. A lateral length of the second groove G2 may be the same as that of the first groove G1.

In an embodiment, the second groove G2 may be formed to have a same shape as the first groove G1, extending perpendicular to the first groove G1. Such a configuration results in an 'H' or 'I' beam shaped groove being formed inside the insulating layer 110 as described in detail elsewhere herein.

The first groove G1 and the second groove G2 may be formed at the dummy portion D of the printed circuit board or at an edge of the printed circuit board.

In some embodiments, a plurality of the second grooves G2 is formed discretely along the pair of first grooves G1 so as to connect the pair of the first grooves G1. In such embodiments, a part of the circuit 120 and/or the via V may be formed between the second grooves G2. In such embodiments, the first groove G1 and the second groove G2 may be formed at the circuit portion C of the printed circuit board.

The operation for filling the pair of first grooves G1 and the second groove G2 with a reinforcing material may include filling the first groove G1 and the second groove G2 with a reinforcing material such as, for example, a metal, a glass cloth, or a combination thereof.

The operation may further include forming a seed layer S inside the first groove G1 and the second groove G2 and forming a plating layer P on the seed layer S. That is, in embodiments where the reinforcing material is a metal, the reinforcement 130 may be formed by a plating process.

The seed layer S may be formed a suitable process such as, for example, an electroless plating process with or without using a catalyst such as palladium. The plating layer P may be formed by an electroplating process on the seed layer S. The plating layer P may grow from the seed layer S in the first groove G1 and the second groove G2 and fill the first groove G1 and the second groove G2.

A width w2 of the second groove G2 may be greater than a thickness t of the first groove G1. The width w2 of the second groove G2 may be may be twice the thickness t of the first groove G1 (see FIG. 4).

When the plating layer P is plated on the seed layer S using isotropic plating, a plating growth rate may be the same on the entire surface of the seed layer S. In some embodiments, the seed layer S is formed on only one surface of the first reinforcement 140, while the seed layer S is formed on both surfaces of the second reinforcement 150. In such embodiments, a plating growth rate of the second reinforcement 150 may be twice as fast as that of the first reinforcement 140. Thus, the width of the second groove G2 may be twice the thickness of the first groove G1 and the first reinforcement 140 and the second reinforcement 150 may be formed at a similar or the same rate.

After forming the reinforcement 130, in some embodiments, the solder resist 160 may be formed. The solder resist 160 may be formed on the insulating layer 110 to cover a part of the circuit 120 and the reinforcement 130 not to be exposed to the outside.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A printed circuit board comprising:
    an insulating layer;
    a circuit disposed on the insulating layer;
    a pair of plate-shaped first reinforcements disposed in the insulating layer, the pair being spatially separated; and
    a second reinforcement configured to connect the pair of plate-shaped first reinforcements,
    wherein a first of the pair of the first reinforcements is disposed in and in contact with a top surface of the insulating layer, and a second of the pair of the first reinforcements is disposed in and in contact with a bottom surface of the insulating layer.

2. The printed circuit board of claim 1, wherein the pair of first reinforcements extend parallel to a surface of the insulating layer, and the second reinforcement passes through the insulating layer across a thickness thereof.

3. The printed circuit board of claim 1, wherein the second reinforcement is formed sequentially following the first reinforcement.

4. The printed circuit board of claim 1, wherein the insulating layer comprises multiple layers, a first of the pair of the first reinforcements is disposed on an uppermost layer of the insulating layer, and a second of the pair of the first reinforcements is disposed on a lowest layer of the insulating layer.

5. The printed circuit board of claim 1, wherein the pair of first reinforcements and the second reinforcement are integrally formed.

6. The printed circuit board of claim 1, wherein a width of the second reinforcement is twice the thickness of each of the pair of first reinforcements.

7. The printed circuit board of claim 1, wherein the second reinforcement has a cross-sectional shape of a quadrilateral, a triangle, a convex or non-convex polygon, a circle, an ellipse, a conic section, or any combination thereof.

8. The printed circuit board of claim 1, wherein a plurality of the second reinforcements are disposed discretely along the pair of first reinforcements.

9. The printed circuit board of claim 8, wherein at least a part of the circuit is arranged between the second reinforcements.

10. The printed circuit board of claim 8, wherein the plurality of second reinforcements have different shapes and cross-sectional areas.

11. A method for manufacturing a printed circuit board, the method comprising:
    forming a circuit on an insulating layer;
    forming a pair of spatially separated plate-shaped first grooves in the insulating layer;
    forming a second groove connecting the pair of first grooves; and
    filling the pair of first grooves and the second groove with a reinforcing material,
    wherein a first of the pair of first grooves is formed in a top surface of the insulating layer, and a second of the pair of first grooves is formed in a bottom surface of the insulating layer.

12. The method of claim 11, wherein the pair of first grooves extend parallel to a surface of the insulating layer, and the second groove passes through the insulating layer across a thickness thereof.

13. The method of claim 11, wherein the second groove is formed sequentially following the first groove.

14. The method of claim 11, wherein the insulating layer comprises multiple layers, a first of the pair of the first grooves is formed on an uppermost layer of the insulating layer, and a second of the pair of first grooves is formed on a lowest layer of the insulating layer.

15. The method of claim 11, wherein the filling the pair of first grooves and the second groove with a reinforcing material comprises forming a seed layer inside the pair of first grooves and the second groove; and forming a plating layer on the seed layer.

16. The method of claim 15, wherein a width of the second groove is twice the thickness of each of the pair of first grooves.

17. The method of claim 11, wherein a plurality of the second grooves are formed discretely along the pair of first grooves.

18. The method of claim 17, wherein at least a part of the circuit is arranged between the second grooves.

19. The method of claim 17, wherein the plurality of second grooves have different shapes and cross-sectional areas.

20. A printed circuit board, comprising:
an insulating substrate;
a circuit disposed on the insulating substrate; and
an I-beam shaped reinforcement structure disposed across a thickness of the insulating substrate,
wherein top and bottom horizontal arms of the I-beam shaped reinforcement structure are disposed in and in contact with top and bottom surfaces of the insulating substrate respectively.

* * * * *